(12) United States Patent
Guo

(10) Patent No.: US 10,763,452 B2
(45) Date of Patent: Sep. 1, 2020

(54) ORGANIC LIGHT-EMITTING DIODE DISPLAY DEVICE, MANUFACTURING METHOD THEREFOR, AND DISPLAY APPARATUS

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventor: Yuanhui Guo, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

(*) Notice: Subject to any disclaimer, the term of this patent is extended or adjusted under 35 U.S.C. 154(b) by 217 days.

(21) Appl. No.: 16/082,095

(22) PCT Filed: Jan. 4, 2018

(86) PCT No.: PCT/CN2018/071340
§ 371 (c)(1),
(2) Date: Sep. 4, 2018

(87) PCT Pub. No.: WO2018/223692
PCT Pub. Date: Dec. 13, 2018

(65) Prior Publication Data
US 2020/0227669 A1     Jul. 16, 2020

(30) Foreign Application Priority Data
Jun. 6, 2017    (CN) .......................... 2017 1 0419655

(51) Int. Cl.
  *H01L 51/52*    (2006.01)
  *H01L 27/32*    (2006.01)
  *H01L 51/00*    (2006.01)

(52) U.S. Cl.
  CPC ...... *H01L 51/5209* (2013.01); *H01L 27/3211* (2013.01); *H01L 51/0023* (2013.01);
  (Continued)

(58) Field of Classification Search
  CPC ............ H01L 51/5209; H01L 51/5265; H01L 51/0023; H01L 27/3211; H01L 27/3244; H01L 2227/323
  See application file for complete search history.

(56) References Cited

U.S. PATENT DOCUMENTS

2003/0057417 A1    3/2003  Lee et al.

FOREIGN PATENT DOCUMENTS

CN    101569013 A    10/2009
CN    103472612 A    12/2013
(Continued)

OTHER PUBLICATIONS

Second Office Action for CN Appl. No. 201710419655.6, dated Mar. 2, 2020.
(Continued)

*Primary Examiner* — Anthony Ho
(74) *Attorney, Agent, or Firm* — Dinsmore & Shohl LLP

(57) ABSTRACT

The present disclosure relates to organic light-emitting diode display device, manufacturing method therefor and display apparatus. The organic light-emitting diode display device comprises: a substrate and a plurality of sub-pixel units arranged on the substrate. Each sub-pixel unit comprises a first electrode, a light-emitting functional layer and a second electrode arranged in this order on the substrate. A surface of the first electrode away from the substrate comprises a
(Continued)

plurality of first grooves arranged in parallel with each other with equal width and equal spacing. A section of the first electrode is serrated. A depth of the plurality of first grooves is less than a maximum distance from the surface of the first electrode away from the substrate to the substrate. For some of the plurality of sub-pixel units, the plurality of first grooves have different widths, and spacings between adjacent two of the plurality of first grooves are different.

20 Claims, 5 Drawing Sheets

(52) U.S. Cl.
CPC ...... *H01L 51/5265* (2013.01); *H01L 27/3244* (2013.01); *H01L 2227/323* (2013.01)

(56) References Cited

FOREIGN PATENT DOCUMENTS

| | | |
|---|---|---|
| CN | 104269495 A | 1/2015 |
| CN | 105097874 A | 11/2015 |
| CN | 105225644 A | 1/2016 |
| CN | 107170789 A | 9/2017 |
| KR | 20140065276 A | 5/2014 |

OTHER PUBLICATIONS

International Search Report and Written Opinion for International Appl. No. PCT/CN2018/071340, dated Apr. 11, 2018.
First Office Action for CN Appl. No. 201710419655.6, dated May 8, 2019.

ORGANIC LIGHT-EMITTING DIODE DISPLAY DEVICE, MANUFACTURING METHOD THEREFOR, AND DISPLAY APPARATUS

CROSS-REFERENCE TO RELATED APPLICATIONS

The present application claims priority under 35 U.S.C. § 371 to International Patent Application No. PCT/CN2018/071340 filed on Jan. 4, 2018, which claims the priority to the Chinese Patent Application No. 201710419655.6 filed on Jun. 6, 2017, each of which is hereby incorporated by reference into the present application in its entirety for all the purposes.

TECHNICAL FIELD

The present disclosure relates to an organic light-emitting diode display device, a manufacturing method therefor, and a display apparatus.

BACKGROUND

In recent years, with the rise of organic light-emitting diode (OLED) technologies, OLED is increasingly used in various luminous display fields. OLED display technologies have characteristics such as self-luminous, wide angle of view (up to 175 degrees or more), quick response speed (1 µs), high luminous efficiency, wide color gamut, low operating voltage (about 3-10V), thin panel (with a thickness less than 1 mm), low cost, ability to make a large size flexible panel and simple production process, such that the OLED display technologies has a broad application value, and a gradually increased market share. As one of the OLED display technologies, top-emitting OLED devices are widely used because of their high aperture ratio. However, cathodes of the top-emitting OLED devices must use metal electrodes, resulting in a greater loss of light.

Therefore, an improved organic light-emitting diode display device and a manufacturing method therefor and a display apparatus are needed.

SUMMARY

In an aspect of this disclosure, an organic light-emitting diode display device is proposed. The organic light-emitting diode display device comprises: a substrate and a plurality of sub-pixel units arranged on the substrate. Each of the plurality of sub-pixel units comprises a first electrode, a light-emitting functional layer and a second electrode arranged in this order on the substrate. A surface of the first electrode away from the substrate comprises a plurality of first grooves arranged in parallel with each other with equal width and equal spacing. A section of the first electrode is serrated. A depth of the plurality of first grooves is less than a maximum distance from the surface of the first electrode away from the substrate to the substrate. For some of the plurality of sub-pixel units, the plurality of first grooves therein have different widths. For some of the plurality of sub-pixel units, spacings between adjacent two of the plurality of first grooves therein are different. Because the surface of the first electrode comprises the plurality of first grooves and the section of the electrode is serrated, the resulting concave-convex structure can destroy the total reflection of light and increase the extraction rate of the light. The plurality of first grooves in some of the plurality of sub-pixel units have different widths, and spacings between adjacent two of the plurality of first grooves in some of the plurality of sub-pixel units are different, so that sub-pixels of different colors have different color saturations, as a result, the chrominance demands of the display terminal can be satisfied to improve the display effect.

According to an embodiment of this disclosure, for some of the plurality of sub-pixel units of different luminous colors, the plurality of first grooves therein have different widths, and spacings between adjacent two of the plurality of first grooves therein are different.

According to an embodiment of this disclosure, the organic light-emitting diode display device further comprises: a cushion layer arranged between the first electrode and the substrate. A surface of the cushion layer away from the substrate comprises a plurality of second grooves arranged in parallel with each other with equal width and equal spacing. A section of the cushion layer is serrated. For some of the plurality of sub-pixel units, the second grooves therein have different widths. For some of the plurality of sub-pixel units, spacings between adjacent two of the plurality of second grooves therein are different. The plurality of second grooves are arranged corresponding, at a one-to-one basis, to the plurality of first grooves. The plurality of second grooves are arranged corresponding, at a one-to-one basis, to the plurality of first grooves in some of the plurality of sub-pixel units, such that spacings between adjacent two of the plurality of first grooves in different sub-pixel units are different, sub-pixel of different colors correspond to different concave and convex structures, whereby different display colors have different color saturations, as a result, the chrominance demands of the display terminal can be satisfied to improve the display effect. According to an embodiment of this disclosure, the material for the cushion layer is an electrically conductive material or a photoresist material. Thus, the display effect of the organic light-emitting diode display device can be further improved.

According to an embodiment of this disclosure, the light-emitting function layer further comprises at least one of: a hole transport layer arranged on a side of the first electrode away from the substrate; a light-emitting layer arranged on a side of the hole transport layer away from the first electrode; and an electron transport layer arranged on a side of the light-emitting layer away from the hole transport layer. Thus, the display effect of the organic light-emitting diode display device can be further improved.

According to an embodiment of this disclosure, a micro-cavity structure is formed between the plurality of first electrodes and the plurality of second electrodes. For some of the plurality of sub-pixel units, the micro-cavity structure has a different cavity length. Thus, the display effect of the organic light-emitting diode display device can be further improved.

According to an embodiment of this disclosure, for some of the plurality of sub-pixel units of the same luminous color, the plurality of first grooves therein have the same width. For some of the plurality of sub-pixel units of the same luminous color, spacings between adjacent two of the plurality of first grooves therein are the same. Thus, widths of the plurality of first grooves in respective sub-pixel units and the distance between adjacent two of the plurality of first grooves can be adjusted according to different luminous colors to improve the display effect.

According to an embodiment of this disclosure, the organic light-emitting diode display device further comprises a drive thin film transistor connected with a first electrode or a second electrode.

According to an embodiment of this disclosure, the organic light-emitting diode display device further comprises a package structure which is arranged on the substrate and encapsulates the plurality of sub-pixel units.

In another aspect of this disclosure, an organic light-emitting diode display apparatus is proposed, comprising the organic light-emitting diode display device described in any of the items above. Therefore, the display apparatus has all the features and advantages of the display device described above, which are omitted herein. In general, the display apparatus has high luminous efficiency and good display effect.

According to an embodiment of this disclosure, for some of the plurality of sub-pixel units have different luminous colors, the plurality of first grooves therein have different widths, and spacings between adjacent two of the plurality of first grooves therein are different.

According to an embodiment of this disclosure, wherein each of the plurality of sub-pixel units further comprises: a cushion layer arranged between the first electrode and the substrate, a surface of the cushion layer away from the substrate comprises a plurality of second grooves arranged in parallel with each other with equal width and equal spacing, a section of the cushion layer is serrated, for some of the plurality of sub-pixel units, the plurality of second grooves therein have different widths, spacings between adjacent two of the plurality of second grooves therein are different, and the plurality of second grooves are arranged corresponding, at a one-to-one basis, to the plurality of first grooves.

In a further aspect of this disclosure, a method of manufacturing an organic light-emitting diode display device is proposed. The organic light-emitting diode display device comprises: a substrate and a plurality of sub-pixel units arranged on the substrate. The method comprises: for each of the plurality of sub-pixel units, forming a first electrode in a region on the substrate corresponding to the sub-pixel unit to be formed, forming a plurality of first grooves arranged in parallel with each other with equal width and equal spacing on a surface of the first electrode away from the substrate, such that a section of the first electrode is serrated, and a depth of the plurality of first grooves is less than a maximum distance from the surface of the first electrode away from the substrate to the substrate; forming a light-emitting functional layer on a side of the first electrode away from the substrate; forming a second electrode on a side of the light-emitting functional layer away from the first electrode, wherein for some of the plurality of sub-pixel units, the plurality of first grooves therein have different widths, and spacings between adjacent two of the plurality of first grooves therein are different. Thus, the organic light-emitting diode display device described above can be conveniently obtained. The method can be directed to sub-pixels of different colors, whereby the resulting first grooves have different widths, and spacings between adjacent two of the plurality of first grooves are different, so that sub-pixels of different colors have different color saturations, which further improves the display effect of the organic light-emitting diode display device obtained by this method.

According to an embodiment of this disclosure, before forming the first electrode, the method further comprises: fabricating a cushion layer whose surface comprises a plurality of second grooves, wherein the plurality of second grooves correspond, at a one-to-one basis, to the plurality of first grooves, comprising: forming a photoresist material layer on the substrate, performing double-beam lithography on the photoresist material layer, and forming the plurality of second grooves arranged in parallel with each other with equal width and equal spacing on a surface of the photoresist material away from the substrate, to obtain the cushion layer whose section is serrated. Thus, by use of the plurality of second grooves in the cushion layer, the plurality of first grooves are formed on a side of the first electrode away from the substrate, so that sub-pixel units of different colors have different color saturations, which further improves the display effect of the organic light-emitting diode display device obtained by the method.

According to an embodiment of this disclosure, the cushion layer is formed by the following steps: forming a photoresist material layer on the substrate, determining an incidence angle and wavelength of light incident to the photoresist material layer according to widths of the plurality of second grooves in the cushion layer of the plurality of sub-pixel units of different luminous colors; by using a photomask, causing the incident light subjected to double-beam lithography to be incident to the surface of the photoresist material layer at the determined incidence angle to form the cushion layer. Thus, the cushion layer can be conveniently obtained, and in the different luminous colors of sub-pixel units, the plurality of second grooves in the cushion layer have different widths, and the distance between adjacent two of the plurality of second grooves is also different, which can further improve the display effect of the organic light-emitting diode display device manufactured by this method.

According to an embodiment of this disclosure, the surface of the photomask comprises at least one of a convex portion, a concave portion and a planar portion. Thus, by using different shapes of photomasks, the above cushion layer can be obtained.

According to an embodiment of this disclosure, the cushion layer is formed by the following steps: forming a photoresist material layer on the substrate; determining an incidence angle and wavelength of light incident to the photoresist material layer according to widths of the plurality of second grooves in the cushion layer of the plurality of sub-pixel units of different luminous colors; imprinting the photoresist material layer using a nano-imprint mask, such that the surface of the photoresist material layer corresponding to the plurality of sub-pixel units of the different luminous colors respectively presents different shapes, and causing the incident light subjected to double-beam lithography to be incident to the photoresist material layer at the determined incidence angle to form the cushion layer. Thus, the cushion layer can be conveniently obtained, and in sub-pixel units of different colors, the plurality of second grooves have different widths, and spacings between adjacent two of the plurality of second grooves are different, which further improves the display effect of the organic light-emitting diode display device manufactured by this method.

According to an embodiment of this disclosure, the surface shape of the photoresist material layer is convex, concave or planar. Thus, by adjusting the shape of the photoresist material layer, the plurality of second grooves with different widths can be obtained, wherein spacings between adjacent two of the plurality of second grooves are also different.

According to an embodiment of this disclosure, the method further comprises forming a drive thin film transistor which is connected with According to an embodiment of this disclosure, the method further comprises forming a package structure which is arranged on the substrate and encapsulates the plurality of sub-pixel units.

BRIEF DESCRIPTION OF THE DRAWINGS

Further features of the present disclosure and/or advantages thereof will become apparent and easily understood from the following detailed description of embodiments with reference to the attached drawings.

DETAILED DESCRIPTION

Figure 1:
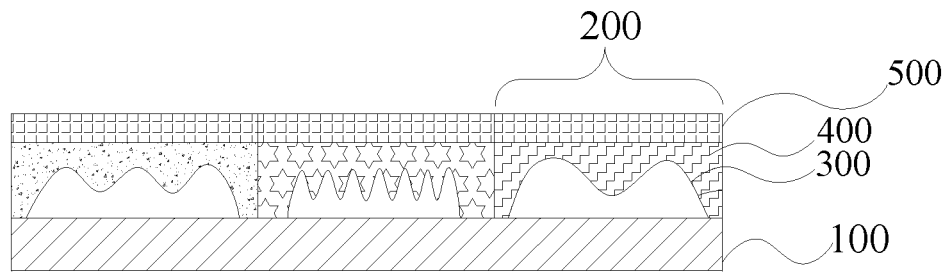
FIG. 1 is a schematic diagram showing a structure of an organic light-emitting diode display device according to an embodiment of this disclosure.

The embodiments of present disclosure will be described in detail below, and examples of the embodiments are shown in the accompanying drawings, wherein throughout the same or similar reference numerals refer to the same or similar elements or elements having the same or similar functions. The embodiments described with reference to the accompanying drawings below are illustrative, only serve to explain the present disclosure, and cannot be construed as limiting the present disclosure.

The inventor found that, organic light-emitting diode (OLED) devices, especially the top-emitting OLED devices, generally have problems such as low light extraction rate, non-ideal actual display effect. At present, based on optical theoretical calculations, the light exit performance of the OLED devices can be improved by optimizing structural parameters. However, even if through theoretical calculations and improvements, the OLED light exit performance is close to its limit performance, because the OLED devices are constructed still as a planarized sandwich structure, a serious optical loss mode always exists, such that the light extraction efficiency of the OLED devices cannot be greatly improved. Although, in order to alleviate this problem, a design of concave-convex structure is introduced to OLED device structure, for destroying the total reflection of the light and improving the light extraction efficiency and performance of the device, the introduction of the concave-convex structure makes it difficult to obtain an ideal color display effect when using the OLED with the concave-convex structure for color display.

The inventor, after extensive research and numerous experiments, found that this mainly because of the need of using OLED to prepare sub-pixels of different colors, such as RGB (red-green-blue) sub-pixels, for color display purposes. However, in OLED based color display devices, sub-pixels of different colors have the same color saturation. However, an actual end product has a different saturation requirement for a different color. For example, for an adobe gamut space, it is required that green has a higher saturation and red has a lower saturation; for a DCI chrominance space, it is required that red has a higher saturation and green has a lower saturation. A too high or too low color saturation will lead to excessive color deviation and color distortion, as a result, the actual display effect of the current OLED devices is not ideal. In addition, when an OLED device is used in an end product adopting a different chrominance space system, because the different chrominance space system has a different color requirement, in case where the film layer structure of the OLED device is determined, it is very difficult to change the color of the OLED. Therefore, on the premise that the RGB sub-pixels are not separately processed, the OLED device cannot be applied to many different end products at the same time, and when the OLED device is used in different end products, the OLED device cannot attain better display effect. Therefore, if the above problems can be solved or alleviated to some extent, the actual use effect of the OLED devices will be greatly improved.

This disclosure is intended to alleviate or solve at least one of the above mentioned problems at least to a certain extent.

In an aspect of this disclosure, an organic light-emitting diode display device is proposed. According to an embodiment of this disclosure, by referring to FIG. 1, the organic light-emitting diode display device comprises: a substrate 100 and a plurality of sub-pixel units 200 arranged on the substrate 100. The sub-pixel unit 200 comprises a first electrode 300, a light-emitting functional layer 400 and a second electrode 500 arranged in this order on the substrate 100. According to an embodiment of this disclosure, a surface of the first electrode 300 away from the substrate 100 comprises a plurality of first grooves arranged in parallel with each other with equal width and equal spacing. A section of the first electrode 300 is serrated. A depth of the first groove is less than a maximum distance from the surface of the first electrode 300 away from the substrate 100 to the substrate 100. According to an embodiment of this disclosure, first grooves in some of the sub-pixel units 200 have different widths, and spacings between adjacent two of the first grooves in some of the sub-pixel units are different. That is to say, the surface of the first electrode 300 away from the substrate 100 have a plurality of first grooves and thus forms a surface with a concave-convex structure. In other words, the section of the first groove can be wedge-shaped (inverted triangle), and the plurality of first grooves are arranged in parallel, so that the surface of the first electrode 300 away from the substrate 100 side has a rugged structure with a serrated section. Thus, in sub-pixel units 200 of different luminous colors, a side of the first electrode 300 away from the surface 100 has a surface with different shapes of concave-convex structure. In other words, in sub-pixel units 200 of different luminous colors, widths of the first grooves are different and spacings between adjacent two of the first grooves are different, while in a same sub-pixel unit 200, the plurality of first grooves have the same width and are arranged with the same spacing. Thus, sub-pixels of different colors have different color saturations, which can satisfy the chrominance requirements of the display terminal and improve the display effect.

It should be noted that, in this disclosure, the depth of the first groove is less than a maximum distance from the surface of the first electrode 300 away from the substrate 100 to the substrate 100. In other words, any one of the first grooves in the first electrode 300 does not penetrate the first electrode 300. That is to say, the first electrode 300 only has a rugged structure on a side away from the substrate. In this disclosure, "the width of the first groove" means the width at the opening of the first groove, which is the maximum width of the first groove.

According to an embodiment of this disclosure, the first grooves may be formed through a special treatment on the surface of the first electrode 300 away from the substrate 100. Alternatively, according to an embodiment of this disclosure, by referring to FIG. 2, the first grooves may be formed also by: providing a cushion layer 310 on a side of the first electrode 300 towards the substrate 100, and then depositing a metal layer on a side of the cushion layer 310 away from the substrate 100, so as to form the first electrode 300, such that the first grooves are formed on a surface of the formed first electrode 300 away from the cushion layer 310.

Figure 2:
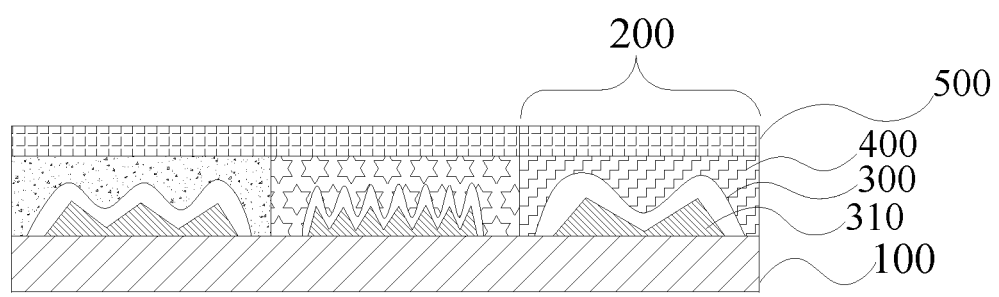
FIG. 2 is a schematic diagram showing a structure of an organic light-emitting diode display device according to another embodiment of this disclosure.

According to an embodiment of this disclosure, by referring to FIG. 2, the sub-pixel unit 200 further comprises a cushion layer 310. According to an embodiment of this disclosure, the cushion layer 310 is arranged between the first electrode 300 and the substrate 100. In each sub-pixel unit 200, the surface of the cushion layer 310 away from the substrate 100 comprises a plurality of second grooves arranged in parallel with each other with equal width and equal spacing. The second grooves correspond, at a one-to-one basis, to the first grooves. That is to say, the section of the cushion layer 310 is serrated. For different sub-pixel units 200, the second grooves therein have different widths and the distance between adjacent two of the second grooves are different. For a same sub-pixel unit 200, the second grooves therein have the same width and spacings between adjacent two of the second grooves in the same sub-pixel unit 200 are the same. In other words, since the first grooves in the first electrode 300 are formed by depositing a metal layer on the cushion layer 310 away from the substrate 100, the shape of the second grooves in the cushion layer 310 can dictate the shape of the first grooves in the first electrode 300. In other words, in a same sub-pixel unit 200, the second grooves can correspond, at a one-to-one basis, to the first grooves, and the shape of the second grooves in the cushion layer of the sub-pixel unit 200 can be set according to the shape of the first grooves to be formed in the sub-pixel unit 200. On the other hand, for different sub-pixel units 200, the widths of the second groove therein are different, and spacings between adjacent two of the second grooves are different, so that for different sub-pixel units 200, widths of the first groove therein are different, and spacings between adjacent two of the first grooves are also different, thus the color saturations of sub-pixels of different colors are different, whereby the chrominance requirement of the display terminal can be satisfied to improve the display effect. In this disclosure, "the width of the second groove" refers to the width at the opening of the second groove, which is the maximum width of the second groove. It should be understood that, in some embodiments, the depth of the second groove is less than a maximum distance from the surface of the cushion layer 310 away from the substrate to the substrate.

Those skilled in the art would appreciate that, a specific material of the substrate 100 is not particularly limited, so long as it can support different sub-pixel units 200. For example, the substrate 100 can be formed from glass or semiconductor material. According to an embodiment of this disclosure, the first electrode 300 is used for hole injection, the second electrode 500 is used for electron injection, and the light-emitting functional layer 400 is used for the recombination of holes and electrons and luminescence. According to an embodiment of this disclosure, a specific material of the cushion layer 310 is not particularly restricted, and for example, it may be an electrically conductive material or photoresist material. Thus, the display effect of the organic light-emitting diode display device can be further improved.

According to an embodiment of this disclosure, a micro-cavity structure is formed between the first electrode 300 and the second electrode 500. For different sub-pixel units 200, the micro-cavity structure has a different cavity length. Thus, the display effect of the organic light-emitting diode display device can be further improved.

Figure 3:
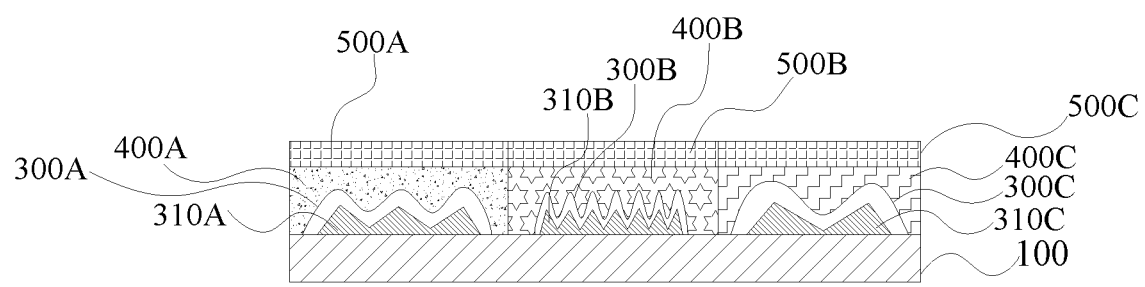
FIG. 3 is a schematic diagram showing a structure of an organic light-emitting diode display device according to a further embodiment of this disclosure.

According to an embodiment of this disclosure, the above plurality of sub-pixel units 200 can be sub-pixel units of different colors. The color of the light-emitting functional layer 400 in the plurality of sub-pixel units 200 is also different. Among a plurality of sub-pixel units 200, first grooves in the sub-pixel unit 200 whose light-emitting functional layer 400 has the same color have the same width, and spacings between adjacent two of the first grooves are the same. Thus, the width of the first grooves in the respective sub-pixel units and the distance between the adjacent two of the first grooves can be adjusted according to different luminous colors to improve the display effect. According to a specific embodiment of this disclosure, by referring to FIG. 3, the above plurality of sub-pixel units 200 can comprise red sub-pixel units, green sub-pixel units, and blue sub-pixel units. For the sub-pixel units 200 of different luminous colors, the first grooves have different widths, and spacings between adjacent two of the first grooves are different. Correspondingly, for the sub-pixel units 200 of different luminous colors, the second grooves have different widths, and the distance between the adjacent two of the second grooves is also different, that is, the sub-pixel units 200 of different luminous colors correspond to different cushion layers 310. In other words, the above red, green, and blue sub-pixel units correspond to different cushion layers 310. For example, a red sub-pixel first electrode 300A, a red sub-pixel light-emitting functional layer 400A and a red sub-pixel second electrode 500A are formed in this order on a side of the red sub-pixel cushion layer 310A away from the substrate 100; a green sub-pixel first electrode 300B, a green sub-pixel light-emitting functional layer 400B and a green sub-pixel second electrode 500B are formed in this order on a side of the green sub-pixel cushion layer 310B away from the substrate 100; a blue sub-pixel first electrode 300C, a blue sub-pixel light-emitting functional layer 400C and a blue sub-pixel second electrode 500C are formed in this order on a side of the blue sub-pixel cushion layer 310C away from the substrate 100. The second grooves in the red sub-pixel cushion layer 310A, the green sub-pixel cushion layer 310B and the blue sub-pixel cushion layer 310C have different widths, and spacings between adjacent two of the second grooves are different. Therefore, the color saturations of sub-pixels of different colors can be different, which can satisfy the chrominance requirement of the display terminal and improve the display effect.

Figure 4:
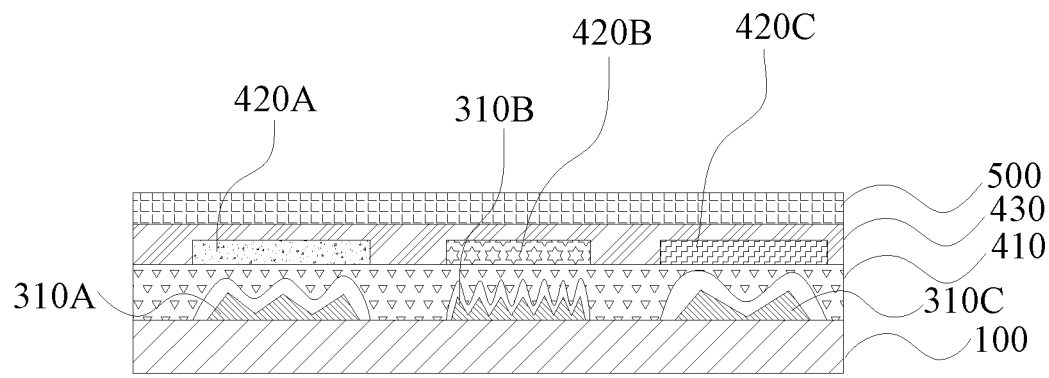
FIG. 4 is a schematic diagram showing a structure of an organic light-emitting diode display device according to a further embodiment of this disclosure.

According to an embodiment of this disclosure, by referring to FIG. 4, the light-emitting functional layer 400 further comprises at least one of: a hole transport layer 410, light-emitting layer 420 (420A-420C shown in the figure) and an electron transport layer 430. According to a specific embodiment of this disclosure, the hole transport layer 410 is arranged on a side of the first electrode 300 away from the substrate 100, and the plurality of sub-pixel units 200 share the hole transport layer 410. According to a specific embodiment of this disclosure, the light-emitting layer 420 is arranged on a side of the hole transport layer 410 away from the first electrode 300 (not shown in the figure). According to a specific embodiment of this disclosure, the electronic transport layer 500 is arranged on a side of the light-emitting layer 420 away from the hole transport layer 410, and the plurality of sub-pixel units 200 can share the electronic transport layer 500. Thus, this can save space and further improve the display effect of the organic light-emitting diode display device. According to a specific embodiment of this disclosure, the light-emitting layer 420 corresponds to a sub-pixel light-emitting layer 420 of a different color according to a different cushion layer 310. For example, the red sub-pixel cushion layer 310A corresponds to a red sub-pixel light-emitting layer 420A, a green sub-pixel cushion layer 310B corresponds to a green sub-pixel light-emitting layer 420B, and a blue sub-pixel cushion layer 310C corresponds to a blue sub-pixel light-emitting layer 420C.

Figure 5:
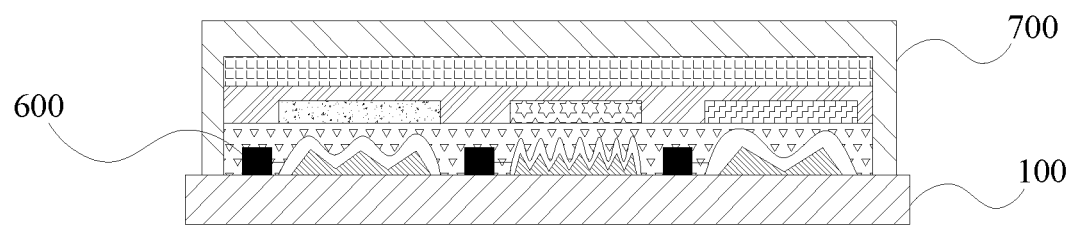
FIG. 5 is a schematic diagram showing a structure of an organic light-emitting diode display device according to a further embodiment of this disclosure.

According to an embodiment of this disclosure, by referring to FIG. 5, the organic light-emitting diode display device may further comprise a package structure 700. According to an embodiment of this disclosure, the package structure 700 is arranged on the substrate 100, and the package structure 700 encapsulates a plurality of sub-pixel units 200. The package structure 700 can isolate water and oxygen in the air and further improve the performance of the organic light-emitting diode display device. According to an embodiment of this disclosure, a specific drive mode of the organic light-emitting diode display device is not restricted, and it may be for example active drive or passive drive. According to a specific embodiment of this disclosure, the organic light-emitting diode display device may further comprise a drive thin film transistor 600. The drive thin film transistor 600 is connected with the first electrode 300 or the second electrode 500. Therefore, the display brightness and resolution of the organic light-emitting diode display device can be further improved, and the color display effect of the organic light-emitting diode display device is improved.

Figure 6:
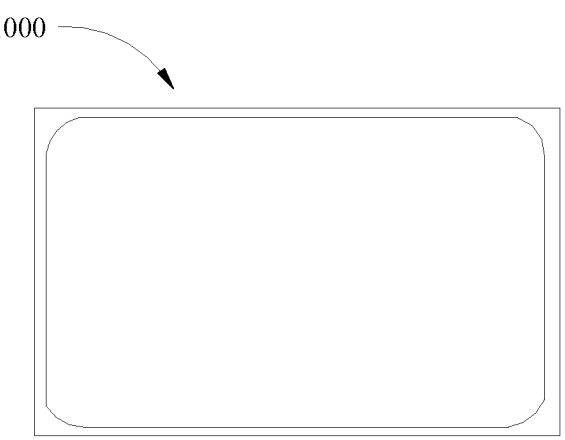
FIG. 6 is a schematic diagram showing a structure of an organic light-emitting diode display apparatus according to an embodiment of this disclosure.

In another aspect of this disclosure, by referring to FIG. 6, an organic light-emitting diode display apparatus 1000 is proposed, comprising the organic light-emitting diode display device described in any one of the above items. As a result, the display apparatus has all the features and advantages of the organic light-emitting diode display device described above, which are omitted herein. In general, the display apparatus has a high luminous efficiency and good display effect.

Figure 7:
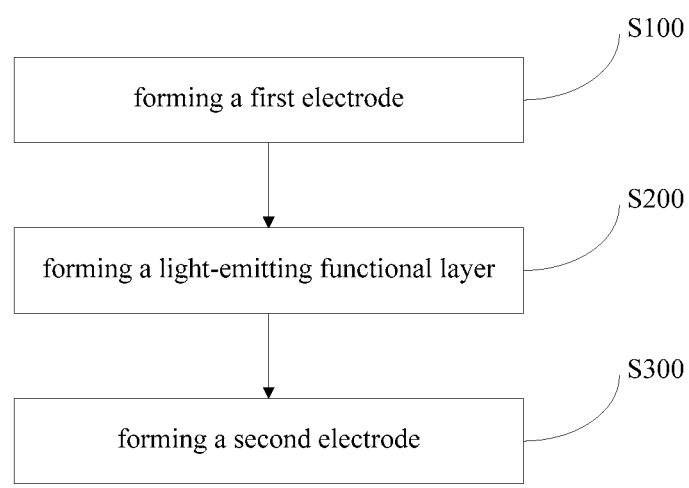
FIG. 7 is a schematic diagram showing a flowchart for forming sub-pixel units according to an embodiment of this disclosure.

In a further aspect of this disclosure, a method of manufacturing an organic light-emitting diode display device is proposed, and according to an embodiment of this disclosure, the organic light-emitting diode display device manufactured by the method may be the organic light-emitting diode display device described above. In other words, the organic light-emitting diode display device comprises a substrate and a plurality of sub-pixel units arranged on the substrate. According to an embodiment of this disclosure, by referring to FIG. 7, the method comprises the following steps.

S100: Forming a First Electrode

This step comprises: forming a first electrode in a region on the substrate corresponding to each of the sub-pixel units, and forming a plurality of first grooves arranged in parallel with each other with equal width and equal spacing on a surface of the first electrode away from the substrate, wherein a section of the first electrode is serrated, and a depth of the first groove is less than a maximum distance from the surface of the first electrode away from the substrate to the substrate.

According to an embodiment of this disclosure, the first electrode may be obtained by a special treatment on a side of the first electrode away from the substrate, and the first electrode obtained comprises first grooves. Alternatively, according to some other embodiments of this disclosure, before forming the first electrode, the method further comprises fabricating a cushion layer whose surface comprise second grooves, and then depositing a metal layer on a side of the cushion layer away from the substrate, in order to form the first electrode.

According to an embodiment of this disclosure, the step of fabricating a cushion layer whose surface comprise second grooves may comprise: first forming a photoresist material layer on the substrate, performing double-beam lithography on the photoresist material layer, and forming a plurality of second grooves arranged in parallel with each other with equal width and equal spacing on a surface of the photoresist material away from the substrate, to obtain the cushion layer whose section is serrated. For some sub-pixel units, the second grooves have different widths, spacings between adjacent two of the second grooves are different, and the second grooves correspond, at a one-to-one basis, to the first grooves. That is, the first electrode is formed on a rugged structure (cushion layer) by using the second grooves in the cushion layer, then the first electrode has a rugged structure on a surface away from the substrate. That is to say, the shape of the second grooves determines the shape of the first groove, for a same sub-pixel unit, the plurality of second grooves have the same width, spacings between adjacent two of the second grooves in the same sub-pixel unit are the same, and spacings between adjacent two of the first grooves are the same. As mentioned above, the second grooves in the cushion layer can dictate the first grooves in the first electrode, so the width of the second grooves in the cushion layer can be the same as the width of the first grooves in the first electrode, and the distance between the adjacent two of the second grooves can be the same with the distance between the adjacent two of the first grooves. Thus, for the plurality of sub-pixel units comprised in the organic light-emitting diode display device, the widths of the first grooves are different, and spacings between adjacent two of the first grooves are also different, which can improve the display effect of the finally obtained organic light-emitting diode display device. According to an embodiment of this disclosure, the cushion layer can be formed by performing double-beam lithography on the photoresist material layer.

The inventor, after extensive research and numerous experiments, found that the double-beam interferometric lithography technology has a simpler optical path system, can achieve a smaller resolution, does not require strict light source conditions, and is applicable to most of the photoresist materials. At present, methods for manufacturing high density concave-convex structures mainly comprise mechanical etching, chemical etching and etc., and these methods cannot manufacture high density concave-convex structures on the order of sub-microns. With the continuous development of laser lithography technologies, lithography technologies are also constantly improved, and lithography technologies are widely used because they can improve the resolution of lithography, and increase the focal depth in actual work. The currently adopted lithography technologies comprise: pupil filtering, phase shift mask (PSM), optical proximity effect correction (OPC), off-axis illumination (OAI), etc., and the photolithography technologies can make the lithography resolution accurate to about 100 nm. However, as compared with the double-beam lithography technology, these method cannot conveniently and synchronously manufacture different concave-convex structures. Those skilled in the art would appreciate that, since a plurality of sub-pixel units are regularly arranged on the substrate, in actual productions, the arrangement of the plurality of sub-pixel units is realized by synchronously arranging on the substrate a plurality of concave-convex structures (i.e., the first electrode surface formed by a plurality of first grooves), and then in subsequent steps, synchronously manufacturing structures such as a plurality of anodes, light-emitting layers and cathodes, but not by separately manufacturing a plurality of sub-pixel units, and then arranging them regularly on the substrate. The inventor through extensive research found that, by manufacturing the first grooves by using the double-beam interferometric lithography technology, it is advantageous that, through a simple adjustment, for sub-pixel units of different luminous colors synchronously obtained, the first grooves have different widths, and spacings between adjacent two of the first grooves are different.

According to an embodiment of this disclosure, the width of the first groove (i.e., by performing the double-beam interference on the photoresist material layer, the width of the second groove in the cushion layer) can be controlled by adjusting the incidence angle and wavelength of the light incident to the photoresist material layer. Thus, by adjusting the incidence angle and wavelength, the second grooves can be obtained conveniently, and the widths of the obtained second grooves are different, that is, the concave-convex structures in the cushion layer are different. Specifically, when using the double-beam lithography, the formula for the light intensity at any point on a plane where an upper surface (the surface on a side that accepts the lithography) of the photoresist material layer is on is:

$$I(x,y)=2I_0[2+\cos(2kx \sin \theta)+\cos(2ky \sin \theta)]$$

Therefore, since a different light intensity is received at a different position on the surface of the photoresist material layer, the degree of etching of the photoresist material layer is different, so that the fabrication of the second grooves in the cushion layer can be realized. The width (d) of the second groove in the cushion layer can be determined by the wavelength and incidence angle of incident light in the double-beam interference method, wherein a relationship between the width (d) and the wavelength and incidence angle of the incident light is as follows:

$$d = \frac{\lambda}{2\sin\theta}$$

It can be known from the formula that, the width (d) is mainly determined by the wavelength and incidence angle of the incident light, and θ represents an angle of incident light with respect to the normal, and the larger the incidence angle θ, the greater the width (d). Thus, the fabrication of the second groove can be realized, and then a plurality of parallel second grooves are fabricated by moving the substrate or light source. It should be noted that, the distance between adjacent second grooves can be zero or nonzero. Since the first groove is formed according to the second groove, spacings between adjacent first grooves can be zero or nonzero. Thus, when fabricating the second grooves in the cushion layer, by changing the incidence angle of the incident light to the photoresist material layer of the sub-pixels of different colors by for example setting a template or adjusting a shape of the upper surface of the photoresist material layer of the sub-pixel units of different colors, the cushion layers corresponding to the sub-pixel units of a plurality of luminous colors can be fabricated in one time, wherein the concave and convex structures in the cushion layer in the sub-pixel units of different luminous colors are different. It can be understood that, in some embodiments, the depth of the second grooves is less than a maximum distance from the surface of the cushion layer 310 away from the substrate to the substrate.

According to a specific embodiment of this disclosure, widths of the first grooves in the first electrodes of red, green and blue sub-pixels and spacings between the adjacent two of the first grooves are between 0.5 microns and 100 microns. For sub-pixel units of different colors, widths of the required first grooves are different, that is, the concave-convex structures in the first electrode are different. The emission spectra of different sub-pixel units can be controlled by controlling the above width (the width of the first groove). Those skilled in the art could understand that the smaller the width, the wider the emission spectrum, and the higher the brightness and the lower the color saturation. The larger the width, the narrower the emission spectrum, and the lower the brightness, the higher the color saturation. According to an embodiment of this disclosure, those skilled in the art could select a specific width according to actual needs.

S200: Forming a Light-Emitting Functional Layer

In this step, the light-emitting functional layer is formed on a side of the first electrode away from the substrate. According to an embodiment of this disclosure, the formed light-emitting functional layer can be the light-emitting functional layer described above, and thus has all the features and advantages of the light-emitting functional layer described above, which are omitted herein.

According to an embodiment of this disclosure, the step of forming the light-emitting functional layer further comprises at least one of the following steps.

S10: Forming a Hole Transport Layer

In this step, the hole transport layer is arranged on a side of the first electrode away from the substrate, and the plurality of sub-pixel units share the hole transport layer.

S20: Forming a Light-Emitting Layer

In this step, the light-emitting layer is arranged on a side of the hole transport layer away from the first electrode. The light-emitting functional layers of different colors have different light-emitting layers. For example, the red sub-pixel light-emitting functional layer has a red sub-pixel light-emitting layer, the green sub-pixel light-emitting functional layer has a green sub-pixel light-emitting layer, and the blue sub-pixel light-emitting functional layer has a blue sub-pixel light-emitting layer.

S30: Forming an Electron Transport Layer

In this step, the electron transport layer is arranged on a side of the light-emitting layer away from the hole transport layer, and the plurality of sub-pixel units share the electron transport layer.

S300: Forming a Second Electrode

In this step, the second electrode is formed on a side of the light-emitting functional layer away from the first electrode. The second electrode formed in this step may be the second electrode described above, which has been described in detail before and thus is omitted herein.

According to an embodiment of this disclosure, the method for manufacturing the organic light-emitting diode display device further comprises at least one of the following steps: forming a drive thin film transistor which is connected with a first electrode or a second electrode, and forming a package structure which is arranged on the substrate and encapsulates a plurality of sub-pixel units.

According to an embodiment of this disclosure, the drive thin-film transistor can further improve the display brightness and resolution of the organic light-emitting diode display device manufactured by this method, and is helpful to improve the color display effect; the package structure can isolate water and oxygen in the air, and further improve the performance of the organic light-emitting diode display devices manufactured by this method.

In general, the method can conveniently obtain the organic light-emitting diode display device described above, has fewer processing steps and good device uniformity, can design and obtain different color saturations for sub-pixels of different colors, and can further improve the display effect of the organic light-emitting diode display device obtained by the method.

The above methods are described in detail below according to the specific embodiments of this disclosure.

Figure 8:
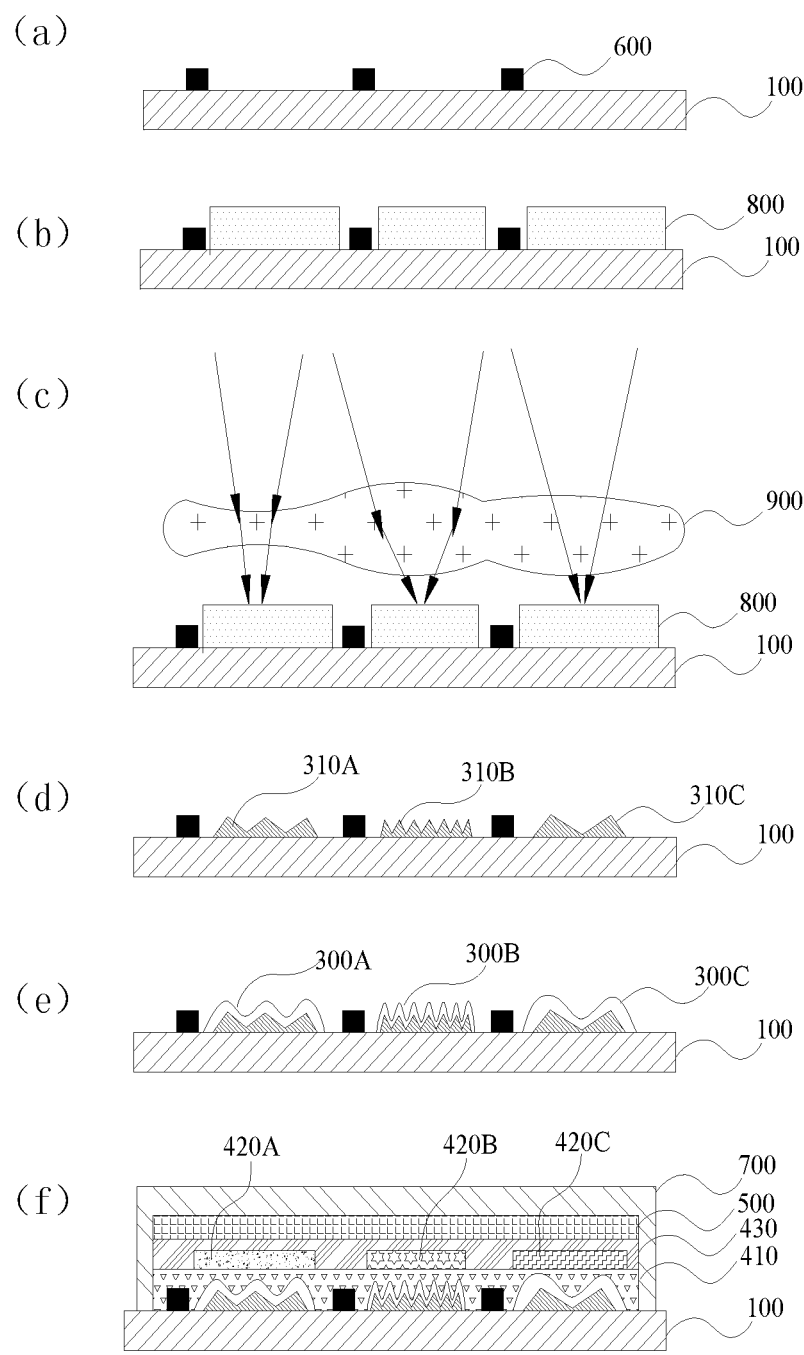
FIG. 8 is a schematic diagram showing a flowchart for manufacturing an organic light-emitting diode display device according to an embodiment of this disclosure.

According to an embodiment of this disclosure, by referring to FIG. 8, the method may comprise the following steps. By referring to (a) in FIG. 8, a drive thin film transistor 600 is arranged on the substrate 100. By referring to (b) in FIG. 8, a photoresist material layer 800 is formed on the substrate 100, wherein the material of the photoresist material layer 800 can be a negative photoresist. By referring to (c) in FIG. 8, an incidence angle and wavelength of the light incident to the photoresist material layer is determined according to the width of the second grooves in the cushion layer of the sub-pixel units of different luminous colors. Then, by using the photoresist mask 900, the incident light subjected to double-beam lithography is incident to the surface of the photoresist material layer at the determined incidence angle, so as to form cushion layers in the subsequent developing step. Regions of the photoresist mask corresponding to sub-pixel unit of different luminous colors have different shapes. According to an embodiment of this disclosure, a specific material for the photoresist mask is not particularly restricted, so long as the high light transmittance required by the double-beam lithography can be satisfied, for example, at least one of glass and polymer materials. According to an embodiment of this disclosed, the surface of the photoresist mask comprises at least one of: a convex portion, a concave portion and a planar portion. Thus, different cushion layers can be obtained in the subsequent steps by adopting different shapes of photoresist masks, and in the sub-pixel units of different luminous colors, the concave-convex structures in the cushion layer are different. By referring to (d) in FIG. 8, the photoresist material layer is developed to obtain different cushion layers. Thus, different cushion layers can be obtained conveniently, and different first electrodes are obtained in the following steps, and the concave and convex structures in the first electrode are different, which further improves the display effect of the organic light-emitting diode display device manufactured by the method. By referring to (e) in FIG. 8, a metal layer is deposited on the cushion layer to obtain the first electrode. Because the first electrode is formed on the cushion layer, on the surface of the obtained first electrode of the sub-pixel units of different luminous colors away from the substrate 100, the concave-convex structures as formed are different. By referring to (f) in FIG. 8, other structures, e.g., the hole transport layer, the light-emitting layer, the electron transport layer and the package structure, are manufactured by using common film-forming processes.

Figure 9:
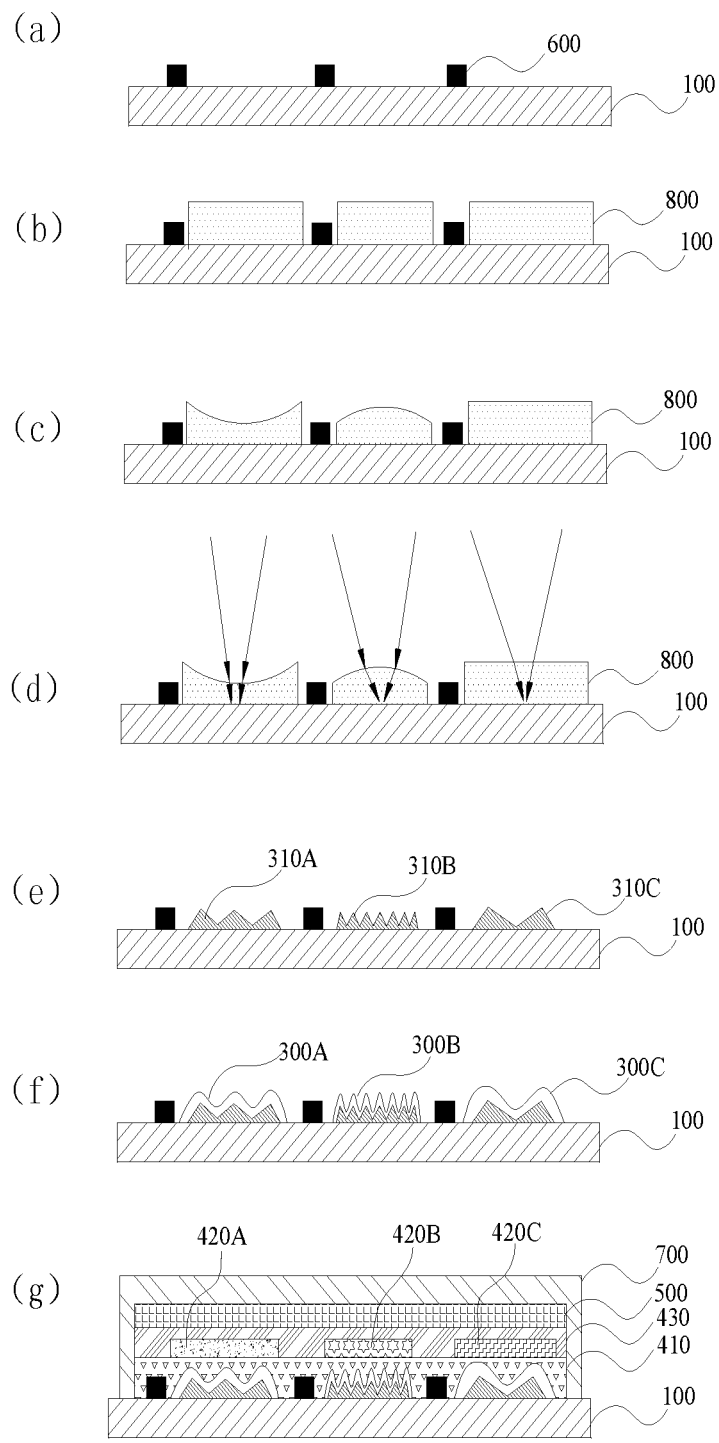
FIG. 9 is a schematic diagram showing a flowchart for manufacturing an organic light-emitting diode display device according to an embodiment of this disclosure.

According to an embodiment of this disclosure, by referring to FIG. 9, the method may comprise the following steps. By referring to (a) in FIG. 9, the drive thin film transistor 600 is arranged on the substrate 100. By referring to (b) in FIG. 9, a photoresist material layer 800 is formed on the substrate 100, wherein the material for the photoresist material layer 800 can be a negative photoresist. By referring to (c) in FIG. 9, an incidence angle and wavelength of the light incident to the photoresist material layer is determined according to the width of the second grooves in the cushion layer of the sub-pixel units of different luminous colors, and then the photoresist material layer is imprinted by using a nano-imprint mask before the photoresist material layer is fully shaped, such that the surfaces of the photoresist material layers corresponding to the sub-pixel units of the different luminous colors respectively present different shapes. By referring to (d) in FIG. 9, because of the different shapes presented on the surfaces of the photoresist material layers, the incident light subjected to double-beam lithography can be incident to the photoresist material layer at the determined incidence angle so as to form cushion layers in the subsequent developing step. It should be noted that, the surface of the photoresist material has different concave and convex structures, the concave-convex structures of the sub-pixel units of different luminescence colors have different concave-convex shapes, and through the concave-convex structures, the refractive state of the light can be changed, and the incidence angle of the incident light can be changed, thereby changing the distance between adjacent two of the second grooves in the sub-pixel units of different luminous colors. According to an embodiment of this disclosure, the surface shape of the photoresist material layer is convex, concave or planar. Thus, different cushion layers can be obtained by adjusting the shape of the photoresist material layer. By referring to (e) in FIG. 9, the photoresist material layer is developed to obtain cushion layers with different spacings between adjacent two of the second grooves. Thus, different cushion layers can be obtained conveniently, and different first electrodes are obtained in the following steps, and the concave and convex structures in the first electrode are different, which further improves the display effect of the organic light-emitting diode display device manufactured by this method. By referring to (f) in FIG. 9, a metal layer is deposit on the cushion layer to obtain the first electrodes. By referring to (g) in FIG. 9, other structures, e.g., the hole transport layer, the light-emitting layer, the electron transport layer and the package structure, are manufactured by using common film-forming processes.

The inventor found that, for the OLED devices manufactured by the double-beam lithography method, on the one hand, by changing the incidence angle and wavelength of the light incident to the photoresist material layer, the concave and convex structures in the first electrodes of sub-pixels of different colors are different, and the color saturations obtained by sub-pixel of different colors are also different, which can greatly improves the display effect of the display apparatus manufactured by using the OLED devices; on the other hand, when utilizing the method to manufacture end products for different chrominance space systems, it is only needed to change the shape of the mask or the shape of the imprint die, and the same production line can be utilized to produce OLED devices that meet needs of different end products.

To sum up, the method of manufacturing the organic light-emitting diode display device has at least one of the following advantages: fewer processing steps; good uniformity and high controllability for the concave-convex structures of the manufactured device; the ability to design and obtain different color saturations for sub-pixel of different colors, which further improves the display effect of the organic light-emitting diode display device obtained by this method.

The solution of this disclosure will be explained below in conjunction with the embodiments. Those skilled in the art would appreciate that, the following embodiments only serve to explain the disclosure, and cannot be regarded as a limit to the scope of this disclosure. Where no specific technology or condition is specified in the embodiment, the embodiment is carried out in accordance with the technology or condition described in the literatures in the art or in accordance with the product specification. If manufacturers of the reagents or instruments used are not indicated, all of them are conventional products that can be obtained in the market.

Example 1

An organic light-emitting diode (OLED) display device comprising a red sub-pixel unit, a green sub-pixel unit and a blue Sub-pixel unit is manufactured. The structure of the OLED display device is shown in FIG. 4. The width of the first groove in the red sub-pixel unit is 2 microns, the width of the first groove in the green sub-pixel unit is 20 microns, and the width of the first groove in the blue sub-pixel unit is 5 microns.

Comparative Example 1

The rest of the structure is the same as Example 1, with a difference that, all the plurality of sub-pixel units do not have the first groove and the second groove, that is, the anode is directly arranged on the substrate, and a surface of the anode away from the substrate does not have a concave-convex structure.

Comparative Example 2

The rest of the structure is the same as Example 1, with a difference that, the width of the first groove in the red sub-pixel unit is 2 microns, the width of the first groove in the green sub-pixel unit is 2 microns, and the width of the first groove in the blue sub-pixel unit is 2 microns.

Comparative Example 3

The rest of the structure is the same as Example 1, with a difference that, the width of the first groove in the red sub-pixel unit is 20 microns, the width of the first groove in the green sub-pixel unit is 20 microns, and the width of the first groove in the blue sub-pixel unit is 20 microns.

A software simulation test for the color and brightness of the OLED display devices manufactured by Example 1 and Comparative examples 1-3 is performed. The color coordinates of the red, green and blue sub-pixel units of each OLED display device are measured using a CIE1931 color space, and the brightness of the red, green and blue sub-pixel units is obtained from the test. Specific test data are shown in Table 1.

|  | Comparative example 1 | Comparative example 2 | Comparative example 3 | Example 1 |
| --- | --- | --- | --- | --- |
| Red color coordinate [CIE1931] | 0.695, 0.31 | 0.68, 0.32 | 0.69, 0.31 | 0.68, 0.32 |
| Red brightness (nit) | 25 | 30 | 27 | 30 |
| Green color coordinate [CIE1931] | 0.20, 0.73 | 0.205, 0.72 | 0.21, 0.71 | 0.21, 0.71 |
| Green brightness (nit) | 40 | 50 | 60 | 60 |
| Blue color coordinate [CIE1931] | 0.14, 0.04 | 0.16, 0.075 | 0.145, 0.045 | 0.15, 0.06 |
| Blue brightness (nit) | 5 | 15 | 8 | 10 |

It can be learned from the above test results that, as compared with Comparative example 1 in which the concave-convex structure is not provided, the brightness of each of the sub-pixel units is increased in Example 1. As compared with Comparative example 2 and Comparative Example 3, in Example 1, because of the use of the first grooves having different widths so that the section of the first electrode is serrated, the concave-convex structure can destroy the total reflection of light and improve the light extraction rate, therefore the sub-pixel of different colors can be controlled to have different saturations, and the situation where the color saturation of a certain color is too high or too low will not occur. Thus, the requirements of a specific display terminal can be satisfied. Meanwhile, as compared with Comparative examples 2 and 3, in Example 1, the brightness of sub-pixel of different colors can also maintain a considerable level.

To sum up, the organic light-emitting diode display device according to an embodiment of this disclosure, can respectively adjust the saturation of various colors of sub-pixels, while improving the brightness of the organic light-emitting diode display device, to meet display requirements of different display terminals.

In this disclosure, the orientation or position relations indicated by the terms "above" and "under" are orientation or position relations shown based on the accompanying drawings, only serve to describe this disclosure but do not require that this disclosure must be constructed and operated with specific orientations, and thus cannot be construed as limiting this disclosure.

In the description of this disclosure, the terms "one embodiment", "another embodiment" and etc. mean that specific characteristics, structures, materials, or features described in combination with the embodiment are contained in at least one embodiment of this disclosure. In the description, the schematic representations of the above terms are not necessarily directed at the same embodiment or example. Furthermore, the specific characteristics, structures, materials, or features described can be combined in an appropriate manner in either or more embodiments or examples. In addition, without contradictions, those skilled in the art could mix and combine the different embodiments or examples described in the description with the characteristics of different embodiments or examples. In addition, it should be noted that, in the description, the terms "first" and "second" only serve to describe this disclosure, but cannot be construed as an indication or imply to relative importance or an implicit indication of the number of technical features indicated.

Although embodiments of the present disclosure are shown and described above, those skilled in the art could appreciate that, the embodiments are illustrative and cannot be construed as limitations to the present disclosure, and various variations, modifications, substitutions and variants may be made by those skilled in the art to the embodiments within the scope of the present disclosure.

What is claimed is:

1. An organic light-emitting diode display device comprising:
    a substrate, and
    a plurality of sub-pixel units arranged on the substrate, wherein each of the plurality of sub-pixel units comprises a first electrode, a light-emitting functional layer and a second electrode arranged in this order on the substrate,
    wherein a surface of the first electrode away from the substrate comprises a plurality of first grooves arranged in parallel with each other with equal width and equal spacing, a section of the first electrode is serrated, a depth of the plurality of first grooves is less than a maximum distance from the surface of the first electrode away from the substrate to the substrate, and
    wherein for some of the plurality of sub-pixel units, the plurality of first grooves therein have different widths, and spacings between adjacent two of the plurality of first grooves therein are different.

2. The organic light-emitting diode display device according to claim 1, wherein for some of the plurality of sub-pixel units have different luminous colors, the plurality of first grooves therein have different widths, and the spacings between adjacent two of the plurality of first grooves therein are different.

3. The organic light-emitting diode display device according to claim 1, wherein each of the plurality of sub-pixel units further comprises:
    a cushion layer arranged between the first electrode and the substrate,
    a surface of the cushion layer away from the substrate comprises a plurality of second grooves arranged in parallel with each other with equal width and equal spacing, a section of the cushion layer is serrated,
    for some of the plurality of sub-pixel units, the plurality of second grooves therein have different widths, the spacings between adjacent two of the plurality of second grooves therein are different, and the plurality of second grooves are arranged corresponding, at a one-to-one basis, to the plurality of first grooves.

4. The organic light-emitting diode display device according to claim 3, wherein a material for the cushion layer is an electrically conductive material or a photoresist material.

5. The organic light-emitting diode display device according to claim 1, wherein the light-emitting functional layer further comprises at least one of:
    a hole transport layer arranged on a side of the first electrode away from the substrate;
    a light-emitting layer arranged on a side of the hole transport layer away from the first electrode; and
    an electron transport layer arranged on a side of the light-emitting layer away from the hole transport layer.

6. The organic light-emitting diode display device according to claim 1, wherein a micro-cavity structure is formed between the plurality of first electrodes and the plurality of second electrodes, and for some of the plurality of sub-pixel units, the micro-cavity structure has a different cavity length.

7. The organic light-emitting diode display device according to claim 1, wherein for some of the plurality of sub-pixel units have the same luminous color, the plurality of first grooves therein have the same width, and the spacings between adjacent two of the plurality of first grooves therein are the same.

8. An organic light-emitting diode display apparatus comprising the organic light-emitting diode display device according to claim 1.

9. The organic light-emitting diode display apparatus according to claim 8, wherein for some of the plurality of sub-pixel units have different luminous colors, the plurality of first grooves therein have different widths, and the spacings between adjacent two of the plurality of first grooves therein are different.

10. The organic light-emitting diode display apparatus according to claim 8, wherein each of the plurality of sub-pixel units further comprises:
    a cushion layer arranged between the first electrode and the substrate,
    a surface of the cushion layer away from the substrate comprises a plurality of second grooves arranged in parallel with each other with equal width and equal spacing, a section of the cushion layer is serrated,
    for some of the plurality of sub-pixel units, the plurality of second grooves therein have different widths, the spacings between adjacent two of the plurality of second grooves therein are different, and the plurality of second grooves are arranged corresponding, at a one-to-one basis, to the plurality of first grooves.

11. The organic light-emitting diode display device according to claim 1, further comprising:
    a drive thin film transistor connected with the first electrode or the second electrode.

12. The organic light-emitting diode display device according to claim 1, further comprising:
    a package structure which is arranged on the substrate and encapsulates the plurality of sub-pixel units.

13. A method of manufacturing an organic light-emitting diode display device, wherein the organic light-emitting diode display device comprises: a substrate and a plurality of sub-pixel units arranged on the substrate, the method comprising:
    for each of the plurality of sub-pixel units, forming a first electrode in a region on the substrate corresponding to the sub-pixel unite to be formed, forming a plurality of first grooves arranged in parallel with each other with equal width and equal spacing on a surface of the first electrode away from the substrate, such that a section of the first electrode is serrated, and a depth of the plurality of first grooves is less than a maximum distance from the surface of the first electrode away from the substrate to the substrate;
    forming a light-emitting functional layer on a side of the first electrode away from the substrate;
    forming a second electrode on a side of the light-emitting functional layer away from the first electrode,
    wherein for some of the plurality of sub-pixel units, the plurality of first grooves therein have different widths, and spacings between adjacent two of the plurality of first grooves therein.

14. The method according to claim 13, wherein before forming the first electrode, the method further comprises fabricating a cushion layer whose surface comprises a plurality of second grooves, wherein the plurality of second grooves correspond, at a one-to-one basis, to the plurality of first grooves, comprising:
  forming a photoresist material layer on the substrate,
  performing double-beam lithography on the photoresist material layer, to form the plurality of second grooves arranged in parallel with each other with equal width and equal spacing on a surface of the photoresist material away from the substrate, so as to obtain the cushion layer whose section is serrated.

15. The method according to claim 14, wherein the cushion layer is formed by:
  forming the photoresist material layer on the substrate,
  determining an incidence angle and wavelength of light incident to the photoresist material layer according to widths of the plurality of second grooves in the cushion layer of the plurality of sub-pixel units of different luminous colors;
  by using a photomask, causing the incident light subjected to double-beam lithography to be incident to the surface of the photoresist material layer at the determined incidence angle to form the cushion layer.

16. The method according to claim 15, wherein the surface of the photomask comprises at least one of a convex portion, a concave portion and a planar portion.

17. The method according to claim 14, wherein the cushion layer is formed by
  forming the photoresist material layer on the substrate;
  determining an incidence angle and wavelength of light incident to the photoresist material layer according to widths of the plurality of second grooves in the cushion layer of the plurality of sub-pixel units of different luminous colors;
  imprinting the photoresist material layer using a nano-imprint mask, such that the surface of the photoresist material layer corresponding to the plurality of sub-pixel units of the different luminous colors respectively presents different shapes, and causing the incident light subjected to double-beam lithography to be incident to the photoresist material layer at the determined incidence angle to form the cushion layer.

18. The method according to claim 17, wherein the surface of the photoresist material layer respectively presents different shapes, and the different shapes comprise at least one of convex, concave or planar shapes.

19. The method according to claim 13, further comprising:
  forming a drive thin film transistor which is connected with the first electrode or the second electrode.

20. The method according to claim 13, further comprising:
  forming a package structure which is arranged on the substrate and encapsulates the plurality of sub-pixel units.

\* \* \* \* \*